(12) United States Patent
Findeklee

(10) Patent No.: US 8,922,212 B2
(45) Date of Patent: Dec. 30, 2014

(54) NOISE MATCHING IN COUPLET ANTENNA ARRAYS

(75) Inventor: Christian Findeklee, Norderstedt (DE)

(73) Assignee: Koninklijke Philips N.V., Eindhoven (NL)

(*) Notice: Subject to any disclaimer, the term of this patent is extended or adjusted under 35 U.S.C. 154(b) by 429 days.

(21) Appl. No.: 13/258,612

(22) PCT Filed: Mar. 26, 2010

(86) PCT No.: PCT/IB2010/051330
§ 371 (c)(1),
(2), (4) Date: Sep. 22, 2011

(87) PCT Pub. No.: WO2010/113093
PCT Pub. Date: Oct. 7, 2010

(65) Prior Publication Data
US 2012/0019250 A1 Jan. 26, 2012

(30) Foreign Application Priority Data
Apr. 1, 2009 (EP) ..................................... 09157070

(51) Int. Cl.
*G01R 33/36* (2006.01)
*H01Q 1/50* (2006.01)
*G01R 33/34* (2006.01)
*G01R 33/3415* (2006.01)

(52) U.S. Cl.
CPC ........ *G01R 33/3415* (2013.01); *G01R 33/3628* (2013.01); *G01R 33/3642* (2013.01)
USPC ............................. 324/318; 324/322; 343/861

(58) Field of Classification Search
CPC ........... G01R 33/3415; G01R 33/3628; G01R 33/3642
USPC .......................................... 324/318; 343/861
See application file for complete search history.

(56) References Cited

U.S. PATENT DOCUMENTS

| 4,682,176 A | 7/1987 | Jones |
| 4,947,121 A | 8/1990 | Hayes |

(Continued)

OTHER PUBLICATIONS

Chatel, Cecile "International Preliminary Report on Patentability," Oct. 4, 2011, EPO, all pages.*

(Continued)

*Primary Examiner* — Melissa Koval
*Assistant Examiner* — Rishi Patel

(57) ABSTRACT

The invention relates to a system comprising an array of two or more receiving antennas (11, 12, 13) for receiving RF signals, each receiving antenna being connected, via a matching network (19, 20, 21), to a low-noise amplifier (22, 23, 24) presenting an input impedance to the matching network (19, 20, 21), each chain consisting of a receiving antenna (11, 12, 13), a matching network (19, 20, 21) and a low-noise amplifier (22, 23, 24) constituting a part of a receiving channel of the system, the matching networks (19, 20, 21) transforming optimum impedances of the low-noise amplifiers (22, 23, 24), the optimum impedances providing optimum noise performance of the low-noise amplifiers (22, 23, 24), wherein each receiving channel comprises at least one switchable impedance (28, 29, 30) at the input of each low-noise amplifier (22, 23, 24) for switching the input impedance as presented to each matching network (19, 20, 21) to a value being the complex conjugate of the optimum impedance of the respective low-noise amplifier (22, 23, 24). The system is arranged to perform an optimization procedure comprising the following steps: a) switching the input impedance as presented to the matching network (19, 20, 21) in each receiving channel to the complex conjugate of the optimum impedance of the respective low-noise amplifier (22, 23, 24); b) receiving RF signals via the receiving antennas (11, 12, 13); c) forming a weighted sum of the signal power of the received RF signals; d) modifying the matching networks (19, 20, 21) of all receiving channels so as to find an optimum matching condition by maximizing the weighted power sum; e) switching the input impedance in each receiving channel back to a value for regular operation of the system.

6 Claims, 3 Drawing Sheets

(56) References Cited

U.S. PATENT DOCUMENTS

| | | | |
|---|---|---|---|
| 7,091,721 | B2 | 8/2006 | Jevtic |
| 2004/0199070 | A1 | 10/2004 | Krockel |
| 2007/0132528 | A1* | 6/2007 | Niiranen et al. ............ 333/128 |
| 2007/0262775 | A1 | 11/2007 | Lee et al. |
| 2008/0129292 | A1 | 6/2008 | Leussler et al. |
| 2009/0027054 | A1* | 1/2009 | Biber et al. ................ 324/318 |
| 2010/0164498 | A1* | 7/2010 | Helvoort et al. ............ 324/322 |

OTHER PUBLICATIONS

Applebaum, S. P.; Adaptive Arrays; 1976; IEEE Trans. on Antennas and Propagation; AP-24(5)585-598.

Findeklee, C.; Improving SNR by Generating Noise Matching for Array Coils; 2009; Proc. Intl. Soc. Mag. Reson. Med.; 17:508.

Ivashina, M. V., et al.; Equivalent System Representation to Model the Beam Sensitivity of Receiving Antenna Arrays; 2008; IEEE Antennas and Wireless Propagation Letters; vol. 7; 733-737.

Maaskant, R., et al.; Applying Active Antenna Impedance to Achieve Noise Match in Receiving Array Antennas; 2007; IEEE Trans on Antennas and Propagation International Symposium; pp. 5889-5892.

Pruessmann, K. P., et al.; SENSE: Sensitivity Encoding for Fast MRI; 1999; MRM; 42:952-962.

Reykowski, A., et al.; Design of Matching Networks for Low Noise Preamplifiers; 1995; MRM; 33:848-852.

Sodickson, D. K., et al.; Simultaneous Acquisition of Spatial Harmonics (SMASH): Fast Imaging with Radiofrequency Coil Arrays; 1997; MRM; 38:591-603.

Warnick, K. F., et al.; Optimal Noise Matching for Mutually Coupled Arrays; 2007; IEEE Trans. on Antennas and Propagation; 55(6)1726-1731.

* cited by examiner

NOISE MATCHING IN COUPLET ANTENNA ARRAYS

FIELD OF THE INVENTION

The invention relates to a method for optimizing the signal-to-noise ratio in a system comprising an array of two or more receiving antennas for receiving RF signals, each receiving antenna being connected, via a matching network, to a low-noise amplifier having an input impedance, each chain consisting of a receiving antenna, a matching network and a low-noise amplifier forming a receiving channel of the system. Moreover the invention relates to a system that is adapted for carrying out the method of the invention.

BACKGROUND OF THE INVENTION

The invention is disclosed in the following in the context of MR (magnetic resonance) imaging. However, it has to be noted that the invention is in the same manner applicable in other fields in which arrays of antennas are used for sensitive reception of RF signals, such as, e.g., in the fields of radio communication technology, mobile communication, radar, or radio astronomy.

Image-forming MR methods, which utilize the interaction between magnetic fields and nuclear spins in order to form two-dimensional or three-dimensional images, are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency).

From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF antennas (coils) which are arranged and oriented within an examination volume of the MR device in such a manner that the variation of the magnetization is measured in the direction perpendicular to the z-axis.

In order to realize spatial resolution in the body, linear magnetic field gradients extending along the three main axes are superposed on the uniform magnetic field, leading to a linear spatial dependency of the spin resonance frequency. The signal picked up in the receiving antennas then contains components of different frequencies which can be associated with different locations in the body. The signal data obtained via the receiving coils is converted to an MR image, e.g., by means of Fourier transformation.

It is well known in the art (see, e.g., U.S. Pat. No. 4,947,121) that by using arrays of two or more receiving antennas for receiving MR signals, multiple datasets can be simultaneously acquired and that these datasets can be combined for significantly improving the sensitivity, i.e. the signal-to-noise ratio (SNR), and/or the field-of-view (FOV). Such arrays consist of closely positioned receiving antennas (e.g. surface coils) which receive MR signals from a common region of interest within the examination volume of the respective MR apparatus. Each receiving antenna is connected, via a matching network, to a low-noise amplifier. Each chain consisting of receiving antenna, matching network and low-noise amplifier constitutes a part of a receiving channel of the MR apparatus. Each receiving channel may include further components, such as an analog-to-digital converter, switches et cetera. The outputs of the channels, each comprising signal and noise, are combined during the image reconstruction process. The combined SNR is influenced by the performance of each individual antenna, the noise correlation between the antennas, as well as by the noise parameters of the low-noise amplifiers.

In contemporary MR systems noise coupling between the individual adjacently positioned receiving antennas is known to have a limiting effect defining the maximum number of antennas within the array to obtain moderate SNR. Modern MR scanners, however, sometimes include arrays with a plurality of receiving antennas by far exceeding this maximum number. This is because recently parallel acquisition techniques have been developed. Methods in this category are SENSE (Pruessmann et al., "SENSE: Sensitivity Encoding for Fast MRI", Magnetic Resonance in Medicine 1999, 42 (5), 1952-1962) and SMASH (Sodickson et al., "Simultaneous acquisition of spatial harmonics (SMASH): Fast imaging with radiofrequency coil arrays", Magnetic Resonance in Medicine 1997, 38, 591-603). SENSE and SMASH use undersampled k-space data acquisition obtained from multiple RF receiving antennas in parallel. In these methods, the (complex) signal data from the multiple coils are combined with complex weightings in such a way as to suppress undersampling artifacts (aliasing) in the finally reconstructed MR images. In either SENSE or SMASH, the acceleration of image acquisition grows with the number of receiving antennas used. Thus a maximum number of receiving channels is generally desirable in order to increase imaging speed as much as possible.

Usually in today's MR systems the individual receiving antennas are decoupled by overlap. Since more distant antennas of the array can not be decoupled in this way, so-called pre-amplifier decoupling is used as an additional measure. This approach makes use of the fact that the input impedance of each low-noise amplifier differs from the optimum impedance that provides an optimal noise performance, i.e. a maximum SNR, of the respective channel. The matching network of each channel, which is switched between the antenna and the low-noise amplifier, transforms the optimum impedance of the respective low-noise amplifier. This type of matching still has a degree of freedom which is used to maximize the impedance as presented to the antenna. In this way the current within each antenna is reduced. However, residual coupling between the antennas is still remaining in the known systems which leads to noise coupling from one low-noise amplifier to the others, thereby reducing the total SNR.

From the foregoing it is readily appreciated that there is a need for an improved method for optimizing the signal-to-noise ratio in a system comprising an array of coupled RF receiving antennas.

SUMMARY OF THE INVENTION

It is consequently an object of the invention to enable noise matching such that a maximized SNR is obtained.

In accordance with the invention, a method for optimizing the signal-to-noise ratio in a system comprising an array of two or more receiving antennas for receiving RF signals is disclosed, wherein each receiving antenna is connected, via a matching network, to a low-noise amplifier presenting an input impedance to the matching network, each chain consisting of a receiving antenna, a matching network and a low-noise amplifier constituting a part of a receiving channel of the system. The method of the invention comprises the steps of:

a) setting the input impedance in each receiving channel to a value that is different from the input impedance value during regular operation of the system;
b) receiving RF signals via the receiving antennas;
c) forming a superposed signal from the received RF signals;
d) modifying the matching networks of all receiving channels so as to find an optimum matching condition on the basis of the superposed signal;
e) re-setting the input impedance in each receiving channel.

The gist of the invention is a specific tuning of the matching networks that differs from the tuning in the known systems. The optimizing procedure of the invention can easily be carried out in production of a corresponding (MR) system. Only a small change of the hardware is required in order to enable setting the input impedance of each low-noise amplifier to a specific value for the duration of the optimization procedure and for re-setting it back to the regular value after the optimization is completed.

No intricate simulation is required, because a simple goal function is available—provided that the input impedances presented to the matching networks are appropriately set—by forming the superposed signal from the RF signals measured during the optimization procedure in accordance with the invention, wherein the matching networks are then modified for finding the optimum matching condition on the basis of this goal function.

According to a practical embodiment of the invention, the input impedance is set and re-set in steps a) and e) by means of a switchable impedance connected to the input of each low-noise amplifier. Electronic switching means such like MEM or PIN switches may be used for this purpose. Simple jumpers are also feasible since the switching is usually performed only once during production of the corresponding system. Dedicated impedances may be connected, via the switches, to the inputs of the low-noise amplifiers in order to obtain the desired impedance value during optimization. As an alternative, the optimization may be performed without using the low-noise amplifiers at all, simply by picking up the signals directly at the outputs of the matching networks, i.e. where the matching networks are connected to the low-noise amplifiers during regular operation. In case the optimization is carried out in this way, i.e. without the low-noise amplifiers, the correct setting of the input impedances, i.e. the impedances presented to the matching networks at their outputs, remains crucial.

In a preferred embodiment of the invention, the power of each RF signal is measured in step b), thereby obtaining a power signal for each receiving channel. The power signals are then superposed in step c) so as to obtain a power sum as the superposed signal, i.e. the goal function. The optimum matching condition can then be found in step d) by simply maximizing the power sum. An insight of the invention is that the goal function formed in this way has a maximum exactly at the optimum matching condition, i.e. where the overall SNR of the system during regular operation takes its maximum value. The power sum is formed by weighted superposition of the power signals, each weighting factor being dependent on the noise figure and the gain of the respective low-noise amplifier. The weighting divides each power signal by the gain and noise figure of the respective low-noise amplifier (the gain used for the weighting is the adapted gain, i.e. the gain resulting from the modified input impedance). It turns out that the correct maximum of the goal function is found in this way under the provision that the value of the input impedance presented to each matching network is set in step a), i.e. at the beginning of the optimization procedure, to the complex conjugate of the optimum impedance, which provides optimum noise performance of the corresponding (single) low-noise amplifier.

Moreover, a system comprising an array of two or more receiving antennas for receiving RF signals is disclosed in accordance with the invention, each receiving antenna being connected, via a matching network, to a low-noise amplifier having an input impedance, each chain consisting of a receiving antenna, a matching network and a low-noise amplifier constituting a part of a receiving channel of the system, wherein the matching networks transform optimum impedances of the low-noise amplifiers, the optimum impedances providing optimum noise performance of the low-noise amplifiers, wherein each receiving channel comprises a switchable impedance at the input of each low-noise amplifier for switching the input impedance as presented to each matching network to a value being the complex conjugate of the optimum impedance of the respective low-noise amplifier.

According to a preferred embodiment of the invention, the system may be an MRI (magnetic resonance imaging) system including at least one main magnet coil for generating a uniform, steady magnetic field within an examination volume, a number of gradient coils for generating switched magnetic field gradients in different spatial directions within the examination volume, wherein the receiving antennas of the array are arranged for receiving MR signals from a body of a patient positioned in the examination volume.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
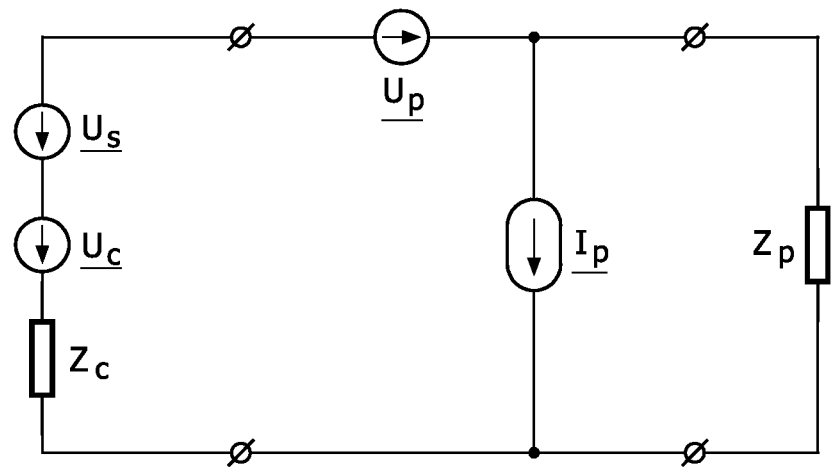
FIG. 1 shows a circuit diagram of a noisy single (isolated) receiving channel.

With reference to FIG. 1 an equivalent circuit of a noisy single channel receive chain is shown. The receive coil (antenna) is represented by the impedance $Z_c$, the noise voltage $U_c$ and the signal voltage $U_s$.

The noise figure F of a low-noise amplifier can be defined as the ratio of the SNR of the input signal in absence of the noise of the low-noise amplifier and the SNR of the output signal including amplifier noise—with the thermal coil noise $\overline{U_c U_c^H} = \sim (Z_c + Z_c^H)$, whereby $Z^H$ denotes the complex conjugate of Z and the line over expressions denotes the covariances of the noisy sources. With the given noise sources at the low-noise amplifier input, the noise figure is a function of the coil impedance $Z_c$ but is not a function of the preamplifier input impedance $Z_p$. The optimum coil impedance $Z_{c,opt}$ for the lowest possible noise figure $F_{opt}$ can be derived as:

$$Z_{c,opt} =: R_{c,opt} + jX_{c,opt}, |Z_{c,opt}| = \sqrt{\frac{\overline{U_p U_p^H}}{\overline{I_p I_p^H}}}, X_{c,opt} = \frac{imag \overline{I_p U_p^H}}{\overline{I_p I_p^H}}$$

If the coil impedance $Z_c$:$R_c$+$jX_C$ deviates from this optimum, the noise figure increases as:

$$F = F_{opt} + \frac{G_{I_p}}{R_c}|Z_c - Z_{c,opt}|^2$$

Therein $D_{I_p}$ denotes the thermal noisy conductance that generates the same noise as $\underline{I}_p$. The SNR at the output of the low-noise amplifier can be expressed by $$SNR_{out} \sim \underline{U}_s^H (Z_c F_{opt} + F_{opt} Z_c^H + 2(Z_c - Z_{c,opt}) \overline{G_{I_p}} (Z_c - Z_{c,opt})^H)^{-1} \underline{U}_s$$

Figure 2:
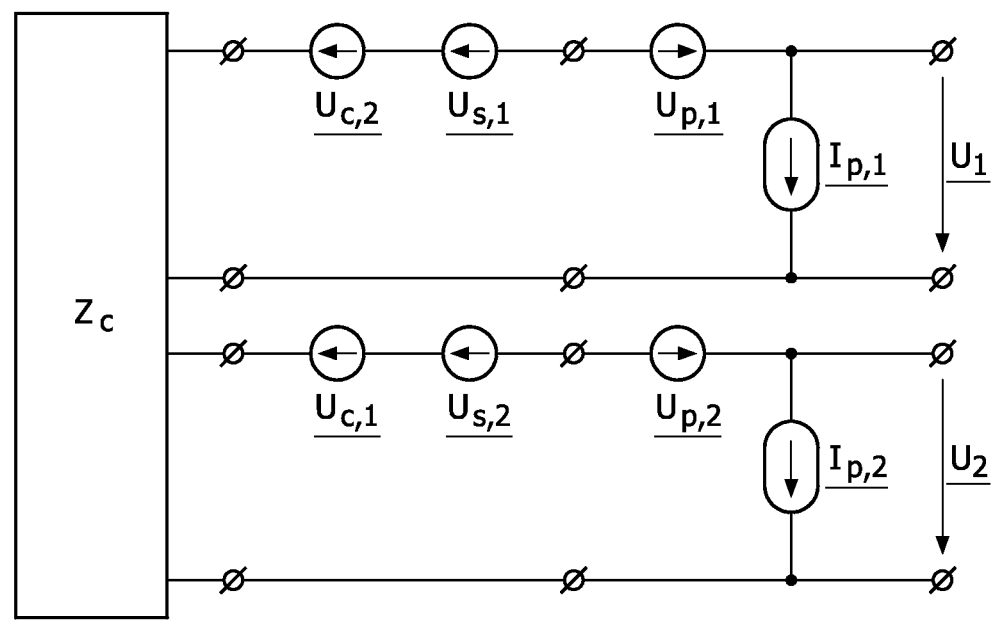
FIG. 2 shows a circuit diagram of two coupled receiving channels.

With reference to FIG. 2, a two-element antenna array attached to two low-noise amplifiers with $Z_p = \infty$ (w.l.o.g.) is shown. The noise current source $\underline{I}_{p,1}$ contributes with $-Z_{c;\ 2,1} \cdot \underline{I}_{p,1}$ in the other channel and vice versa (noise coupling).

It can be shown that for the case of coupled array coils the SNR expression derived above can be interpreted as a matrix equation:

$$SNR_{out} \sim \underline{U}_s^H (Z_c[F_{opt}] + [F_{opt}]Z_c^H + (Z_c - [Z_{c,opt}])[2G_{I_p}](Z_c - [Z_{c,opt}])^H)^{-1} \underline{U}_s$$

In this equation, the squared brackets have to be evaluated channel-wise forming diagonal matrices, and the parameters $Z_{c,opt}$ and $G_{I_p}$ have to be interpreted as parameters of the single low-noise amplifiers, including the matching circuits attached to the same. ($Z^H$ now denotes the transpose complex conjugate of Z.)

Using network theory, a similar expression can derived for a weighted combination of power $\tilde{P}$. In this new function, the signal power received in each individual low-noise amplifier impedance $Z_p = R_p + jX_p$ is divided by a corresponding real scalar φ:

$$\tilde{P} \sim \underline{U}_s^H \left( Z_c[\Phi] + [\Phi]Z_c^H + (Z_c - [Z_p^H]) \left[ \frac{\Phi}{2R_p} \right] (Z_c - [Z_p^H])^H \right)^{-1} \underline{U}_s$$

It can further be shown that for [φ]:=[$F_{opt}$], both of the above functions have the same optimum impedance [$Z_{c,opt}$]= [$Z_p^H$], if $Z_c[F_{opt}]+[F_{opt}]Z_c^H$ is positive-semidefinite. This means, that the optimum matching condition can be found by modifying the inputs of the low-noise amplifiers such that they present the complex conjugate of their own single channel optimum impedance, and provide a matching such that the weighted power sum—each channel power divided by the individual (adapted) gain and noise figure—at the outputs of the low-noise amplifiers is maximized. After the optimization is completed, the input modification of the low-noise amplifiers is removed.

Figure 3:
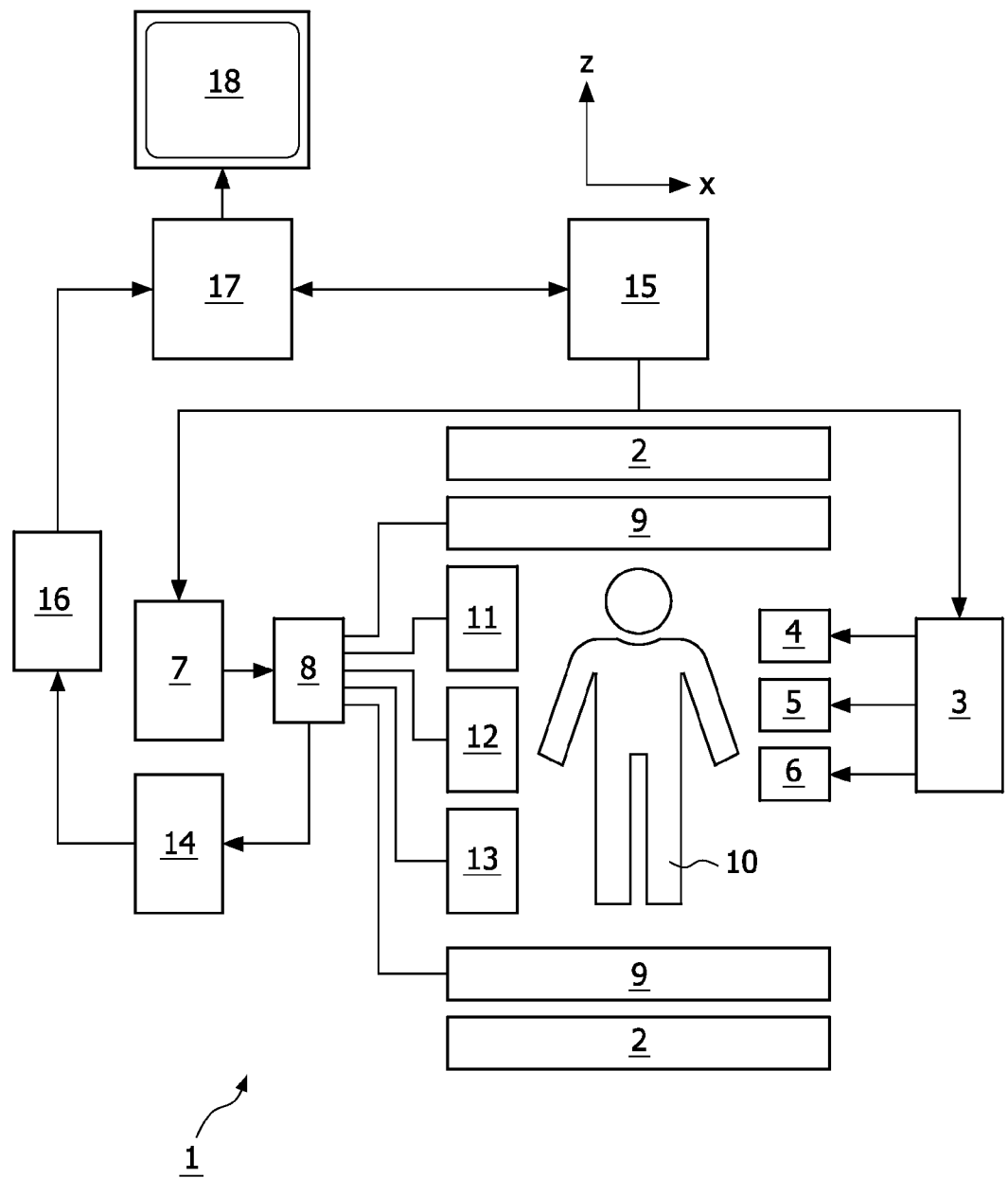
FIG. 3 shows an MR device for carrying out the method of the invention as a block diagram.

With reference to FIG. 3, an MR device 1 is shown that constitutes a system within the meaning of the invention. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10 by means of parallel imaging, an array of receiving antennas (i.e. local RF coils) 11, 12, 13 are placed contiguous to the region selected for imaging. The individual coil elements 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14. The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 4:
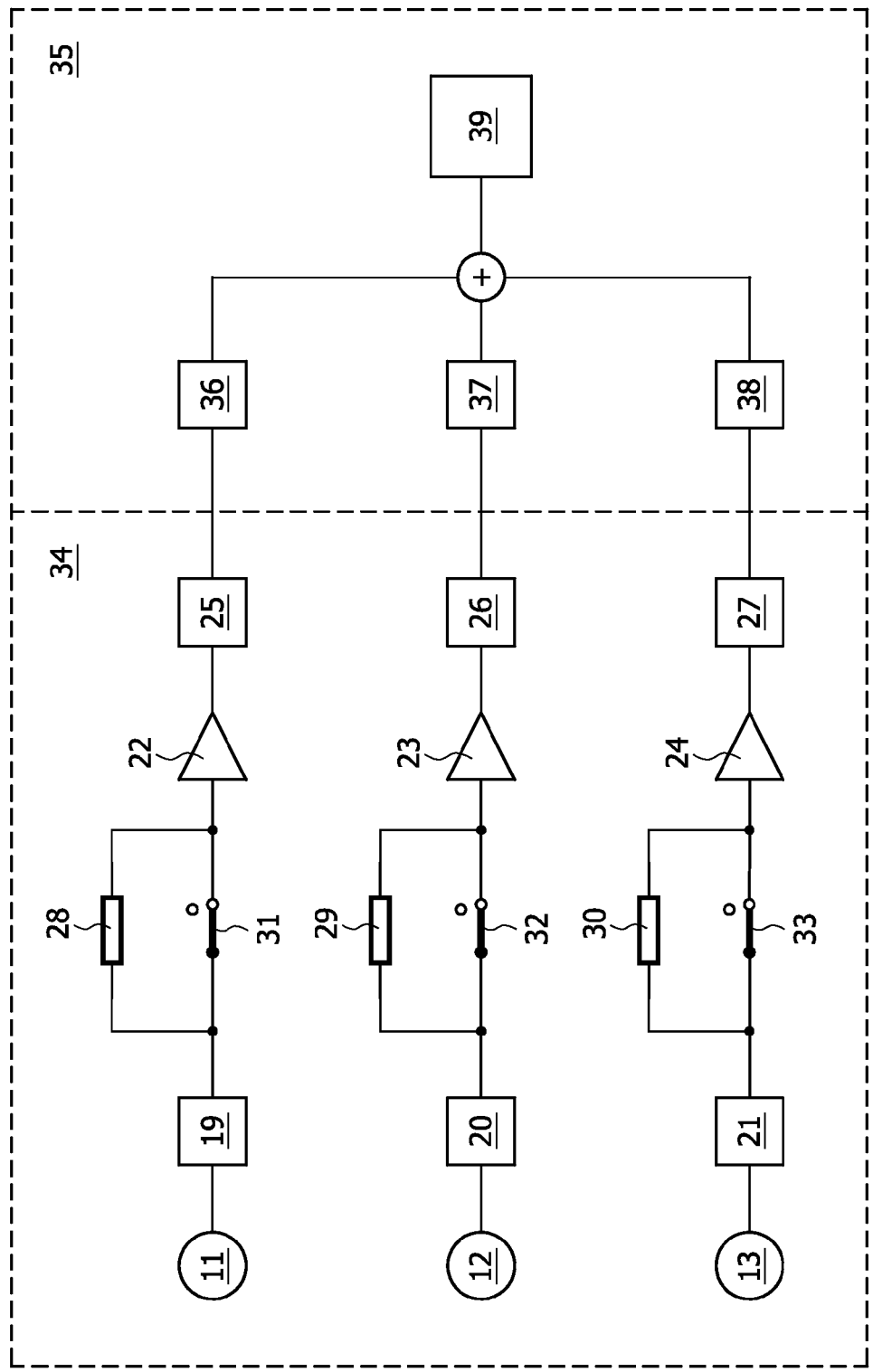
FIG. 4 shows two receiving channels of the MR device shown in FIG. 3 in more detail.

With reference to FIG. 4, the receiving channels of the MR device are shown in more detail. The RF coils (receiving antennas) 11, 12 and 13 are connected, via matching networks 19, 20, 21, to low-noise amplifiers 22, 23, 24. The matching networks 19, 20, 21 transform optimum impedances of the low-noise amplifiers 22, 23, 24, which optimum impedances provide optimum noise performance of the low-noise amplifiers. Series impedances 28, 29, 30 connected to the inputs of the low-noise amplifiers 22, 23, 24 can be activated or deactivated by means of switches 31, 32, 33 for the purpose of setting the input impedances of the low-noise amplifiers 22, 23, 24 to the complex conjugate of the (single channel) optimum impedance as required during the optimization procedure of the invention. The impedance value of each series impedance 28, 29, 30 is $Z^*_{opt} - Z_{in}$, wherein $Z^*_{opt}$ is the complex conjugate of the optimum impedance of the respective channel and wherein $Z_{in}$ is the regular input impedance of the low-noise amplifier. After opening the switches 31, 32, 33 RF signals (such as, e.g., test signals generated by means of an appropriate transmission antenna during the optimization procedure) are received via the array and output RF signals are measured at the outputs of the low-noise amplifiers 22, 23, 24. Power meters 25, 26, 27 are connected to the outputs of the low-noise amplifiers 22, 23, 24. The part in the left dashed box 34 in FIG. 4 is realized as hardware components, while the part in the right box 35 may be realized in software. Weightings 36, 37, 38 are applied by dividing each power signal by the individual gain (as modified during optimization) and noise figure (i.e. the unmodified characteristic noise figure of the low-noise amplifier). If all low-noise amplifiers 22, 23, 24 have the same gain and noise figure the weighting may be dispensed with. The weighted power signals are superposed (i.e. summed up) so as to obtain a sum signal which is output via a display 39. The parameters of the matching networks 19, 20, 21 of all receiving channels are tuned until a maximum of the displayed sum signal is found. Finally the input impedances of the low-noise amplifiers 25, 26, 27 are re-set to their original values by closing the switches 31, 32, 33. Now the system is ready for regular operation, wherein the overall SNR of the system is significantly increased as compared to conventional systems.

The invention claimed is:

1. A method for optimizing the signal-to-noise ratio in a system comprising an array of two or more receiving antennas for receiving RF signals, each receiving antenna being connected, via a corresponding matching network, to a corresponding low-noise amplifier presenting an input impedance to the matching network, wherein each receiving antenna, the corresponding matching network and the corresponding low-noise amplifier comprise a receiving channel of the system, the method comprising the steps of:
    a) setting the input impedance in each receiving channel to a value specific for an optimisation procedure;
    b) receiving RF signals via the receiving antennas;
    c) measuring a power of each RF signal to obtain a power signal for each receiving channel;
    d) forming a superposed signal from the received RF signals, wherein the superposed signal is formed by weighted superposition of the power signals;
    e) modifying the matching networks of all receiving channels so as to find an optimum matching condition on the basis of the superposed signal, wherein the matching networks transform optimum impedances of the low-noise amplifiers, the optimum impedances providing optimum noise performance of the low-noise amplifiers; and
    f) re-setting the input impedance in each receiving channel to an original value.

2. The method of claim 1, wherein the input impedance is set and re-set in steps a) and f) by a switchable impedance connected to the input of each low-noise amplifier.

3. The method of claim 1, wherein the power signals are superposed in step d) so as to obtain the superposed signal, the optimum matching condition being found in step e) by maximizing the superposed signal when the value of the input impedance is set in step a) to a value being a complex conjugate of the optimum impedance of the respective low-noise amplifier.

4. The method of claim 3, wherein each weighting factor is dependent on a noise figure and a gain of the corresponding low-noise amplifier.

5. A system, comprising:
    an array of two or more receiving antennas for receiving RF signals;
    matching networks corresponding to each of the receiving antennas;
    low-noise amplifiers corresponding to each of the receiving antennas, each receiving antenna being connected, via the corresponding matching network, to the corresponding low-noise amplifier presenting an input impedance to the matching network;
    wherein each receiving antenna, the corresponding matching network and the corresponding low-noise amplifier comprising a receiving channel of the system,
    at least one switchable impedance at an input of each low-noise amplifier for switching the input impedance as presented to each matching network to a value being a complex conjugate of the optimum impedance of the corresponding low-noise amplifier;
    power meters corresponding to each receiving channel to measure a power of each RF signal received in each receiving channel to obtain a power signal for each receiving channel; and
    a processor configured to form a superposed signal from the received RF signals, wherein the superposed signal is formed by weighted superposition of the power signals, wherein the matching networks of all receiving channels are modified so as to find an optimum matching condition on the basis of the superposed signal, wherein the matching networks transform optimum impedances of the low-noise amplifiers, the optimum impedances providing optimum noise performance of the low-noise amplifiers.

6. The system according to claim 5, wherein the system is an MRI system including at least one main magnet coil for generating a uniform, steady magnetic field within an examination volume, a number of gradient coils for generating switched magnetic field gradients in different spatial directions within the examination volume, wherein the receiving antennas of the array are arranged for receiving MR signals from a body of a patient positioned in the examination volume.

* * * * *